(12) United States Patent
Ho

(10) Patent No.: US 10,840,160 B2
(45) Date of Patent: Nov. 17, 2020

(54) DISPLAY DEVICE AND METHOD FOR REPAIRING AND DETECTING THIN FILM TRANSISTOR OF DISPLAY DEVICE

(71) Applicant: AU Optronics (Kunshan) Co., Ltd., Kunshan (CN)

(72) Inventor: Meng Hsiu Ho, Kunshan (CN)

(73) Assignee: AU OPTRONICS (KUNSHAN) CO., LTD., Kunshan (CN)

( * ) Notice: Subject to any disclaimer, the term of this patent is extended or adjusted under 35 U.S.C. 154(b) by 0 days.

(21) Appl. No.: 16/494,493

(22) PCT Filed: Oct. 10, 2018

(86) PCT No.: PCT/CN2018/109602
§ 371 (c)(1),
(2) Date: Sep. 16, 2019

(87) PCT Pub. No.: WO2019/223212
PCT Pub. Date: Nov. 28, 2019

(65) Prior Publication Data
US 2020/0168516 A1    May 28, 2020

(30) Foreign Application Priority Data

May 25, 2018  (CN) .......................... 2018 1 0516614

(51) Int. Cl.
*H01L 21/66* (2006.01)
*G09G 3/00* (2006.01)
(Continued)

(52) U.S. Cl.
CPC ............. *H01L 22/32* (2013.01); *G09G 3/006* (2013.01); *H01L 21/76894* (2013.01);
(Continued)

(58) Field of Classification Search
CPC ......... H01L 22/32; H01L 22/14; H01L 22/22; H01L 27/124; H01L 27/1214; H01L 21/76894; G09G 2330/12; G09G 3/006
See application file for complete search history.

(56) References Cited

U.S. PATENT DOCUMENTS 9,167,663 B2 * 10/2015 Kim .................... H01L 27/3276
9,608,125 B2 *  3/2017 Cai ........................ G09G 3/006
(Continued)

FOREIGN PATENT DOCUMENTS

CN         102034683 B      3/2013
CN         104635113 B      7/2017
(Continued)

*Primary Examiner* — Michael M Trinh
(74) *Attorney, Agent, or Firm* — WPAT, PC

(57) ABSTRACT

Disclosed are a display device and a method for repairing and detecting a thin film transistor of the display device. The display device includes a plurality of thin film transistors, a gate line, a data line, and a testing circuit. The testing circuit includes a first detection pad, a second detection pad, a third detection pad, a first detection metal wire, and a second detection metal wire. The first detection metal wire is connected to the second detection pad. The second detection metal wire has a first branch, a detection metal pad, and a second branch. The first branch connects the first detection pad and the detection metal pad. The second branch connects the third detection pad and the detection metal pad. The detection metal pad overlaps with the first detection metal wire in a vertical direction. The first detection metal wire has a width same as that of the gate line, and the detection metal pad has a width same as that of the data line.

13 Claims, 3 Drawing Sheets

(51) Int. Cl.
  *H01L 21/768* (2006.01)
  *H01L 27/12* (2006.01)
(52) U.S. Cl.
  CPC .............. *H01L 22/14* (2013.01); *H01L 22/22* (2013.01); *H01L 27/124* (2013.01); *G09G 2330/12* (2013.01)

(56) References Cited

U.S. PATENT DOCUMENTS

| | | | |
|---|---|---|---|
| 9,618,815 B2 * | 4/2017 | Lee | G02F 1/136286 |
| 10,276,456 B2 * | 4/2019 | Ji | H01L 22/32 |
| 2014/0117860 A1 * | 5/2014 | Kim | H01L 27/3276 315/169.1 |
| 2016/0328062 A1 * | 11/2016 | Jin | G02F 1/1345 |
| 2018/0331091 A1 * | 11/2018 | Wang | H01L 22/32 |

FOREIGN PATENT DOCUMENTS

| | | |
|---|---|---|
| CN | 108598094 A | 9/2018 |
| TW | M387276 U | 8/2010 |
| TW | I400515 B | 7/2013 |

* cited by examiner

DISPLAY DEVICE AND METHOD FOR REPAIRING AND DETECTING THIN FILM TRANSISTOR OF DISPLAY DEVICE

TECHNICAL FIELD

The present disclosure relates to a display device, and also relates to a method for repairing and detecting thin film transistor in the display device.

BACKGROUND ART

With the improvement of display device manufacturing technology, it is not difficult to provide a display device of large-size, high-resolution and high-brightness. In the manufacturing process, good quality control is an important fact of improving the overall qualification rate, in addition to improving product quality and providing better specifications.

During the manufacturing process of an active element array substrate, an inspection process is generally performed to detect a defect in the display device, and laser repairing process is performed for this defect. The existing laser repairing process may cut off the residual metal film with appropriate energy without damaging the underlying insulating layer to repair a defect, such as a short circuit, between the films. However, when the laser energy is unstable or inappropriate, a repair line may be formed at the defect, such that the desired repair cannot be achieved, resulting in a failure in the repair process. Moreover, a failure in repairing a short-circuit defect of a metal film cannot be detected by a worker on site in real time, and a repair result can be determined after a resistance value of conductive glass layer is measured in a subsequent process. When the resistance value is measured, the active element array substrate which has not been successfully repaired due to inappropriate laser energy may remain in production line for subsequent processing, resulting in a waste of manpower and materials in the subsequent processing.

In view of the above, it is required to monitor whether the laser repair energy is appropriate in the laser repairing process in real time, such that the laser repairing failure can be detected in time, thereby reducing the possibility that an active element array substrate which has not been successfully repaired will remain in a production line for subsequent processing.

Disclosure of the Present Invention

According to one embodiment of the present invention, a display device comprises a plurality of thin film transistors, a gate line, a data line, and a testing circuit. Each of the plurality of thin film transistors has a gate electrode, a source electrode, and a drain electrode, the gate line is coupled to the gate electrode of the thin film transistor, and the data line is coupled to the drain electrode or the source electrode of the thin film transistor. The testing circuit comprises a first detection pad, a second detection pad, a third detection pad, a first detection metal wire and a second detection metal wire. The first detection metal wire is connected to the second detection pad. The second detection metal wire has a first branch, a detection metal pad, and a second branch, the first branch connects the first detection pad and the detection metal pad, the second branch connects the third detection pad and the detection metal pad, and the detection metal pad overlaps with the first detection metal wire in a vertical direction. A width of the first detection metal wire is the same as a width of the gate line, and a width of the detection metal pad is the same as that of the data line.

In one embodiment of the present invention, a material of the first detection metal wire is the same as a material of the gate line, and a material of the detection metal pad is the same as a material of the data line.

In one embodiment of the present invention, the first detection metal wire and the gate line are formed by a same mask process, and the detection metal pad and the data line are formed by a same mask process.

In one embodiment of the present invention, the detection metal pad has an opening.

According to another embodiment of the present invention, a display device comprises a substrate, a first metal layer, an insulating layer, a second metal layer, a thin film transistor, and a testing circuit. The first metal layer is disposed on the substrate, the insulating layer is disposed on the first metal layer, and the second metal layer is disposed on the insulating layer, such that the insulating layer is positioned between the first metal layer and the second metal layer. The thin film transistor comprises a gate electrode, a source electrode and a drain electrode. The gate electrode is patterned-formed of the first metal layer, and the source electrode and the drain electrode are patterned-formed of the second metal layer, respectively. The testing circuit comprises a first detection pad, a second detection pad, a third detection pad, a first detection metal wire and a second detection metal wire. The first, second and third detection pads are disposed on the substrate, respectively. The first detection metal wire is patterned-formed of the first metal layer, electrically connected to the second detection pad, and electrically insulated from the gate electrode. The second detection metal wire is patterned-formed of the second metal layer, electrically connected to the first and third detection pads, and electrically insulated from the source and drain electrodes. The second detection metal wire intersects with the first detection metal wire to form an intersection region.

In another embodiment of the present invention, the display device further comprises a gate line coupled to the gate electrode and a width of the gate line is the same as a width of the first detection metal wire.

In another embodiment of the present invention, the display device further comprises a data line coupled to the drain electrode or the source electrode and a width of the data line is the same as a width of the intersection region of the second detection metal wire.

In another embodiment of the present invention, the second detection metal wire comprises a first branch, a detection metal pad and a second branch. The first branch connects the first detection pad and the detection metal pad, the second branch connects the third detection pad and the detection metal pad, and the detection metal pad is positioned in the intersection region.

In another embodiment of the present invention, the substrate comprises a display area and a peripheral area adjacent to the display area. The thin film transistor is disposed in the display area, and the testing circuit is disposed in the peripheral area.

In another embodiment of the present invention, the second detection metal wire has an opening in the intersection region.

According to further embodiment of the present invention, a method for repairing and detecting a thin film transistor of the display device described above comprises:

S100 for cutting the second detection metal wire in the intersection region by laser;

S200 for detecting a resistance value between the first detection pad and the third detection pad, and increasing the laser energy when the detected resistance value is less than a threshold value;

S300 for detecting a resistance value between the first detection pad and the second detection pad, and decreasing the laser energy when the detected resistance value is less than a threshold value; and S400 for determining the laser energy for repairing to be appropriate when each of the resistance values between the first and third detection pads and between the first and second detection pads is detected to be greater than the respective threshold values.

In further embodiment of the present invention, the step S200 is performed prior to the step S300, or the step S300 is performed prior to the step S200.

The invention will be described in detail below with reference to the accompanying drawings and specific embodiments, but they are not intended to limit the invention.

Figure 1:
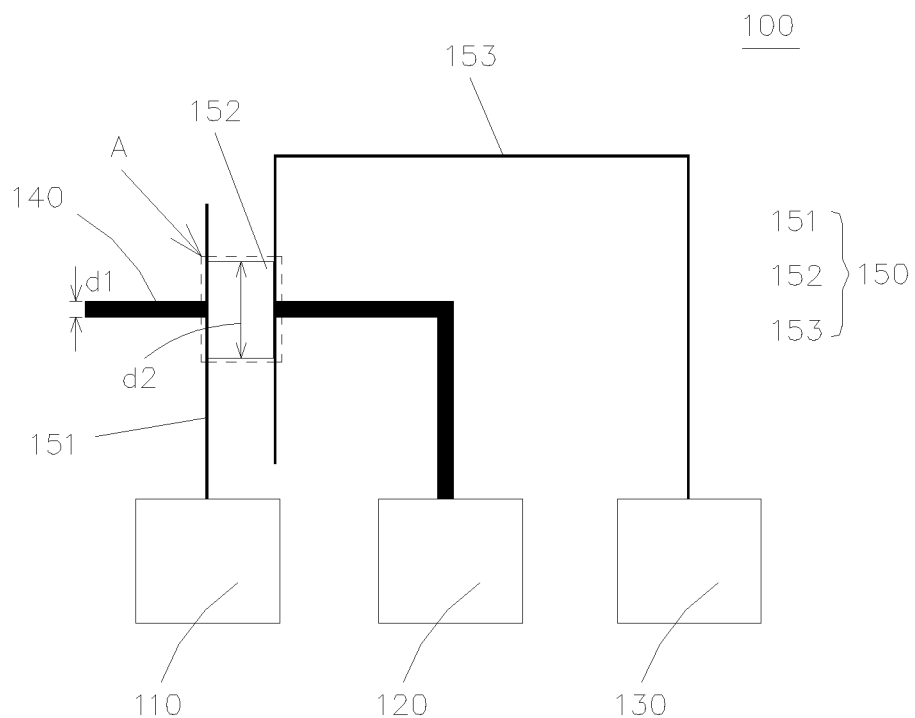
FIG. 1 is a schematic view of a testing circuit of a display device according to a first embodiment of the present invention.

REFERENCE NUMERALS 100 testing circuit
110 first detection pad
120 second detection pad
130 third detection pad
140 first detection metal wire
150 second detection metal wire
151 first branch
152 detection metal pad
153 second branch
200 first metal layer
300 insulating layer
400 second metal layer
500 testing circuit
510 first detection pad
520 second detection pad
530 third detection pad
540 first detection metal wire
550 second detection metal wire
551 first branch
552 detection metal pad
553 second branch
S opening

DETAILED DESCRIPTION OF THE EXEMPLARY EMBODIMENTS

The present invention will be described in detail with reference to the accompanying drawings and specific embodiments, in order to further illustrate the objectives, solutions and effects of the present invention, but they are not intended to limit the scope of the present invention.

A display device according to an embodiment of the present invention comprises a plurality of thin film transistors, a gate line, and a data line. Each of the thin film transistors has a gate electrode, a source electrode and a drain electrode. The gate line is coupled to the gate electrode of the thin film transistor, and the data line is coupled to the drain electrode or the source electrode of the thin film transistor. The above disclosure is same as that in the prior art and well known by those skilled in the art, it is not the essential technical content of the present invention and will not be described in detail herein.

Moreover, the display device according to the embodiment of the present invention comprises a testing circuit 100. In the first embodiment as shown in FIGS. 1 to 6, the testing circuit 100 is used for repairing and detecting the thin film transistor of the display device. The display device further comprises a substrate, such as an active element array substrate. A plurality of films are formed on the substrate.

In one embodiment, a first metal layer 200, an insulating layer 300 and a second metal layer 400 are sequentially disposed on the substrate of the display device. That is, the first metal layer 200 is disposed on the substrate, the insulating layer 300 is disposed on the first metal layer 200, and the second metal layer 400 is disposed on the insulating layer 300, such that the insulating layer 300 is located between the first metal layer 200 and the second metal layer 400. Specifically, the gate electrode of the thin film transistor is patterned-formed of the first metal layer 200, and the source electrode and the drain electrode of the thin film transistor are patterned-formed of the second metal layer 400, respectively.

In one embodiment, the substrate comprises a display area and a peripheral area adjacent to the display area. The thin film transistors are disposed in the display area, and the testing circuit 100 is preferably disposed in the peripheral area and is remained in the display device or cut off as required. In particular, the testing circuit 100 comprises a first detection pad 110, a second detection pad 120, a third detection pad 130, a first detection metal wire 140 and a second detection metal wire 150. The first detection pad 110, the second detection pad 120, and the third detection pad 130 are disposed on the substrate, respectively.

In one embodiment, the first detection metal wire 140 is patterned-formed of the first metal layer 200, connected to the second detection pad 120, and insulated from the gate electrode of the thin film transistor. In other words, both the first detection metal wire 140 and the gate electrode in the display area are made of a material of the first metal layer 200. For example, the first detection metal wire 140 and the gate electrode are formed by a same mask process, but the invention is not limited thereto. In addition, the first detection metal wire 140 and the gate electrode are not connected to each other by metallic element, such that the first detection metal wire 140 and the gate electrode are not electrically conductive to each other without any signal interfere therebetween. The second detection metal wire 150 is patterned-formed of the second metal layer 400, electrically connected to the first detection pad 110 and the third detection pad 130, respectively, and electrically insulated from the source and drain electrodes of the thin film transistor. Specifically, both the second detection metal wire 150 and the source electrode or the drain electrode in the display area are made of a material of the second metal layer 400. For example, the second detection metal wire 150 and the source electrode or the drain electrode are formed by a same mask process, but the invention is not limited thereto. In addition, the second detection metal wire 150 and the source or drain electrode are not connected to each other by metallic element, such that the second detection metal wire 150 and the source or drain electrode are not electrically conductive to each other without any signal interfere therebetween.

Further, the second detection metal wire 150 comprises a first branch 151, a detection metal pad 152 and a second branch 153. The first branch 151 is connected to the first detection pad 110 and the detection metal pad 152, and the second branch 153 is connected to the third detection pad 130 and the detection metal pad 152. The detection metal pad 152 overlaps with the first detection metal wire 140 in a vertical direction. That is, the second detection metal wire 150 intersects with the first detection metal wire 140 to form an intersection region (as shown by a dashed block A in FIG. 1) where the detection metal pad 152 of the second detection metal wire 150 is located.

In one embodiment, a width d1 of the first detection metal wire 140 is same as a width of a gate line coupled to the gate electrode of the thin film transistor. That is, the width d1 of the first detection metal wire 140 is same as the width of the gate line in the first metal layer 200. A width d2 of the detection metal pad 152 (or the intersection region) of the second detection metal wire 150 is same as a width of a data line coupled to the drain electrode or the source electrode of the thin film transistor. That is, the width d2 of the detection metal pad 152 (or the intersection region) of the second detection metal wire 150 is same as the width of the data line in the second metal layer 400.

In one embodiment of the present invention, the first detection metal wire 140 is used to simulate the gate line, and the detection metal pad 152 (or the intersection region) of the second detection metal wire 150 is used to simulate the data line. When the display area is repaired, the testing circuit 100 can be repaired by laser at the same time. The repairing result within the display area can be ascertained by observing or measuring the electrical parameters of the testing circuit 100. When the detecting result is unsatisfied, the laser energy can be adjusted immediately to improve the repair effect.

In the embodiment of the present invention, the first detection metal wire 140 is made of a same material as the gate line, and the detection metal pad 152 is made of a same material as the data line. In one embodiment, the first detection metal wire 140 and the gate line are formed by a same mask process, and the detection metal pad 152 and the data line are formed by a same mask process, such that the width of the first detection metal wire 140 is same as the width of the gate line and the first detection metal wire 140 is made of a same material as the gate line, and the width of the detection metal pad 152 is same as the width of the data line and the detection metal pad 152 is made of a same material as the data line.

In the first embodiment of the present invention as shown in FIG. 1, the detection metal pad 152 of the second detection metal wire 150 of the testing circuit 100 completely overlap with the first detection metal wire 140 in the vertical direction. That is, the first detection metal wire 140 and the second detection metal wire 150 intersect with each other in a vertical projection direction in the intersection region, where the first detection metal wire 140 is completely covered by the second detection metal wire 150.

Figure 2:
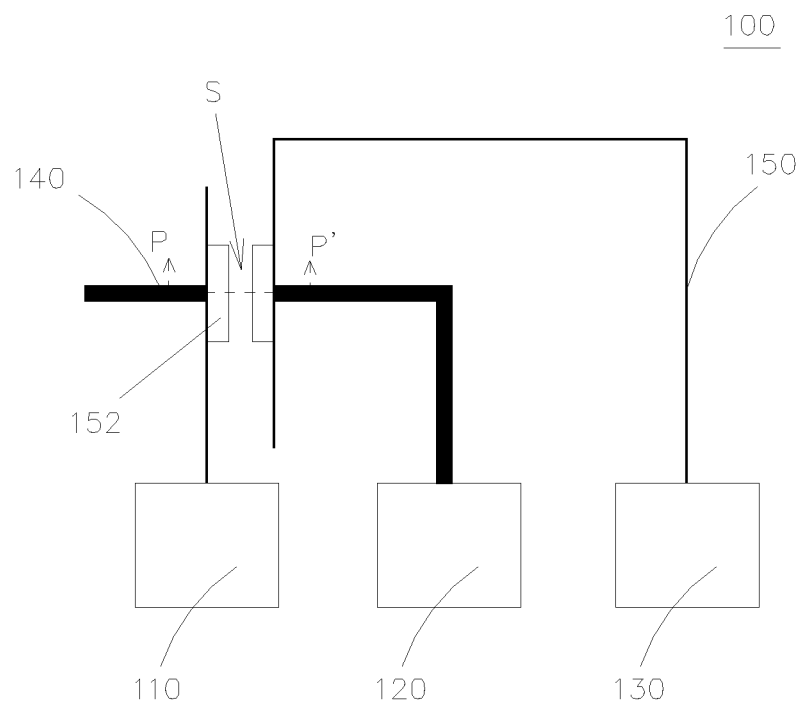
FIG. 2 is a schematic view of the testing circuit of the display device after laser cutting according to the first embodiment of the present invention.

As shown in FIG. 2, while the display area is repaired by laser, the testing circuit 100 is repaired by laser at the same time. Specifically, the width d2 of the detection metal pad 152 is set to be same as the width of the data line in the display area to simulate the residual film of the data line in the display area by using the detection metal pad 152. While the data line in the display area is repaired by laser, the detection metal pad 152 of the testing circuit 100 is irradiated, cut and repaired by laser having a same energy to simulate the cutting and repairing of the data line in the display area by laser.

After the residual film is cut off by laser (as shown in S of FIG. 2), the electrical parameters between the first detection pad 110, the second detection pad 120 and the third detection pad 130 of the testing circuit 100 are detected to ascertain the repairing result in the display area. Specifically, referring to FIGS. 3 to 5 showing cross-sectional views taken along the line P-P' of FIG. 2, FIGS. 3 to 5 illustrate the layers in the intersection region after laser repairing by using laser having different energy.

Figure 3:
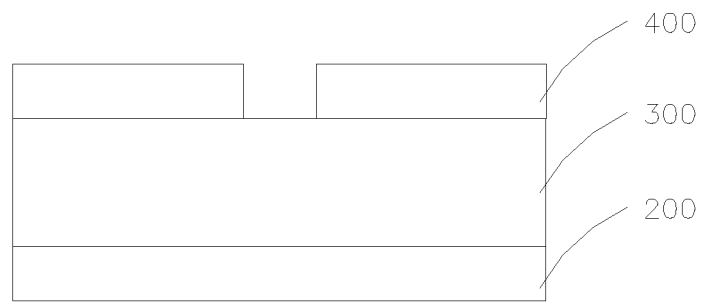
FIG. 3 is a cross-sectional view of the repaired intersection region in the testing circuit of the display device according to the first embodiment of the present invention by applying appropriate laser energy for repairing.

When the laser for repairing has appropriate energy, the second metal layer 400 (i.e., the detection metal pad 152) as shown in the cross-sectional view of FIG. 3 can be completely cut off. At this time, referring to FIG. 2, each of the resistance value between the first detection pad 110 and the third detection pad 130 and the resistance value between the first detection pad 110 and the second detection pad 120 is detected to be greater than a threshold value (e.g., the resistance value>1E+11 ohms).

That is, when each of the resistance value between the first detection pad 110 and the third detection pad 130 and the resistance value between the first detection pad 110 and the second detection pad 120 is detected to be greater than a threshold value, the laser for repairing can be determined to have appropriate energy which is capable of cutting off the residual film.

Figure 4:
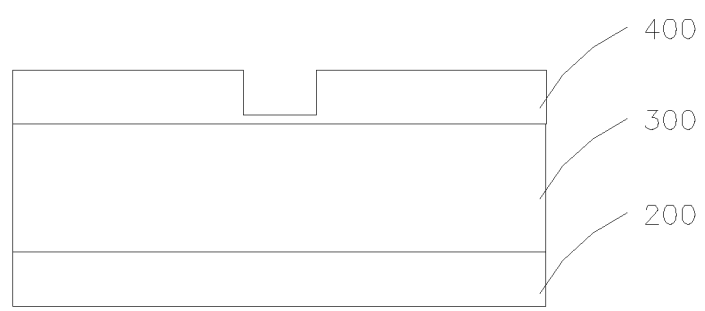
FIG. 4 is a cross-sectional view of the repaired intersection region in the testing circuit of the display device according to the first embodiment of the present invention by applying insufficient laser energy for repairing.
Figure 5:
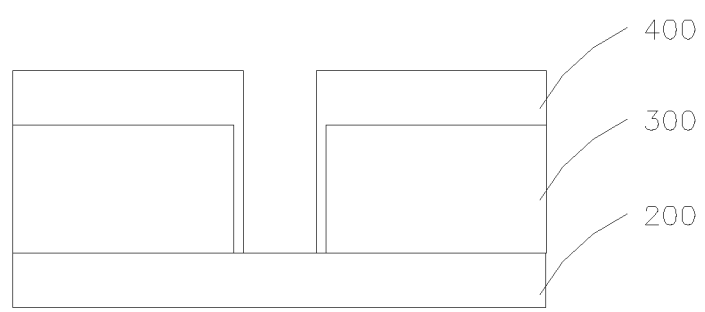
FIG. 5 is a cross-sectional view of the repaired intersection region in the testing circuit of the display device according to the first embodiment of the present invention by applying exceeding laser energy for repairing.

As shown in FIG. 4, when the laser for repairing has insufficient energy, the second metal layer 400 (i.e., the detection metal pad 152) as shown in the cross-sectional view of FIG. 4 cannot be completely cut off. At this time, referring to FIG. 2, the resistance value between the first detection pad 110 and the third detection pad 130 is detected to be less than a threshold value (e.g., the resistance value<1E+11 ohms). Specifically, the detection metal pad 152 is not completely cut off and a residual film remains, such that the first detection pad 110 and the third detection pad 130 are connected by a metal layer therebetween, resulting in a short circuit. In other words, when the resistance value between the first detection pad 110 and the third detection pad 130 is detected to be less than a threshold value, the laser for repairing can be determined to have insufficient energy and the energy of the laser is required to be increased.

As shown in FIG. 5, when the laser for repairing has exceeding energy, the second metal layer 400 (i.e., the detection metal pad 152) as shown in the cross-sectional view of FIG. 5 is completely cut off and meanwhile the insulating layer 300 is cut off. At this time, referring to FIG.

2, the resistance value between the first detection pad 110 and the second detection pad 120 is detected to be less than a threshold value (e.g., the resistance value<1E+11 ohms), because the insulating layer 300 between the second metal layer 400 and the first metal layer 200 is cut through due to the excessively high laser energy for repairing, and the second metal layer 400 is melted and flow downwards to be connected to the underlying first metal layer 200, resulting in short circuit between the first detection pad 110 and the second detection pad 120.

That is, when the resistance value between the first detection pad 110 and the second detection pad 120 is detected to be less than a threshold value, the laser for repairing can be determined to have exceeding energy and the energy of the laser is required to be decreased.

In an alternative embodiment, the first detection metal wire 140 is used to simulate the gate electrode of the thin film transistor, and the detection metal pad 152 of the second detection metal wire 150 is used to simulate the drain electrode or the source electrode of the thin film transistor. While the display area is repaired, the testing circuit 100 can be repaired by laser at the same time, and the repairing result within the display area can be ascertained by observing or measuring the electrical parameters of the testing circuit 100.

The first detection metal wire 140 is made of a same material as the gate electrode of the thin film transistor, and the detection metal pad 152 is made of a same material as the drain electrode or the source electrode of the thin film transistor. In one embodiment, the first detection metal wire 140 and the gate electrode of the thin film transistor are formed by a same mask process, and the detection metal pad 152 and the drain electrode or the source electrode of the thin film transistor are formed by a same mask process, such that a width of the first detection metal wire 140 is same as a width of the gate line and the first detection metal wire 140 is made of a same material as the gate line, and a width of the detection metal pad 152 is same as a width of the data line and the detection metal pad 152 is made of a same material as the data line.

In view of above, the testing circuit 100 of the present invention can not only simulate the repaired residual film of the gate line and the data line, but also simulate the repaired residual film of the gate electrode, the drain electrode or the source electrode of the thin film transistor.

According to an embodiment of the present invention, a method for repairing and detecting a thin film transistor comprises:

S100 for cutting the second detection metal wire in the intersection region by laser;

S200 for detecting a resistance value between the first detection pad and the third detection pad, and increasing the laser energy when the detected resistance value is less than a threshold value;

S300 for detecting a resistance value between the first detection pad and the second detection pad, and decreasing the laser energy when the detected resistance value is less than a threshold value; and S400 for determining the laser energy for repairing to be appropriate when each of the resistance values between the first and third detection pads and between the first and second detection pads is detected to be greater than the respective threshold values.

The step S200 is performed prior to the step S300. Alternatively, the step S300 is performed prior to the step S200.

Specifically, as shown in FIGS. 1 to 5, firstly, the step S100 is performed, that is, the detection metal pad 152 of the second detection metal wire 150 is cut by laser.

Then, the resistance value between the first detection pad 110 and the third detection pad 130 is detected in the step S200. When the detected resistance value between the first detection pad 110 and the third detection pad 130 is greater than a threshold value (e.g., the resistance value>1E+11 ohms), as shown in FIG. 3, the laser energy is determined to be sufficient to cut off the residual film. However, when the detected resistance value between the first detection pad 110 and the third detection pad 130 is less than the threshold value, as shown in FIG. 4, the laser energy is determined to be insufficient to cut off the residual film and is required to be increased.

After the resistance value between the first detection pad 110 and the third detection pad 130 is detected to be greater than the threshold value, the step S300 is performed.

The resistance value between the first detection pad 110 and the second detection pad 120 is detected in the step S300. When the detected resistance value between the first detection pad 110 and the second detection pad 120 is greater than a threshold value (e.g., the resistance value>1E+11 ohms), as shown in FIG. 3, the first detection metal wire 140 and the second detection metal wire 150 are determined to be not short-circuited. However, when the detected resistance value between the first detection pad 110 and the second detection pad 120 is less than the threshold value, as shown in FIG. 5, the laser energy is determined to be excessively high, such that the insulating layer 300 between the second metal layer 400 and the first metal layer 200 is cult through and the second metal layer 400 is melted and flow downwards to be connected to the underlying first metal layer 200. At this time, the laser energy is required to be reduced.

The sequences of the steps S200 and S300 are not specifically limited. That is, after the detection metal pad 152 (the intersection region) of the second detection metal wire 150 is cut by laser, the resistance value between the first detection pad 110 and the third detection pad 130 is detected, and then the resistance value between the first detection pad 110 and the second detection pad 120 is detected; alternatively, the resistance value between the first detection pad 110 and the second detection pad 120 is detected, and then the resistance value between the first detection pad 110 and the third detection pad 130 is detected.

When each of the resistance values between the first detection pad 110 and the third detection pad 130 and between the first detection pad 110 and the second detection pad 120 is detected to be greater than the respective threshold value, the adjusted laser energy for repairing can be determined to be appropriate.

After the repairing, as shown in FIG. 2, an opening S is formed in the detection metal pad 152 or the intersection region of the second detection metal wire 150 due to laser cutting. Depending on the laser energy, the opening S is an opening that completely cuts off the detection metal pad 152 as shown in FIG. 3, an opening that partially cuts off the detection metal pad 152 as shown in FIG. 4, or an opening formed by melting the second metal layer 400 such that the second metal layer 400 flows downwards to be connected to the underlying first metal layer 200 as shown in FIG. 5.

In the display area, since the residual film of the second metal layer does not completely cover the first metal layer, and only partially covers the first metal layer. A place where the second metal layer is not provided will be irradiated by laser when the laser repairing is performed. In a case that the metal layer have same thickness, material, and the like as the first embodiment, when applying the laser energy suitable for the first embodiment in which the residual film of the second metal layer completely cover the first metal layer, the insulating layer is cut through, resulting in short-circuit between the second metal layer and the first metal layer. To this end, the testing circuit of the second embodiment of the present invention simulates a situation where the residual film of the second metal layer partially covers the first metal layer.

Figure 6:
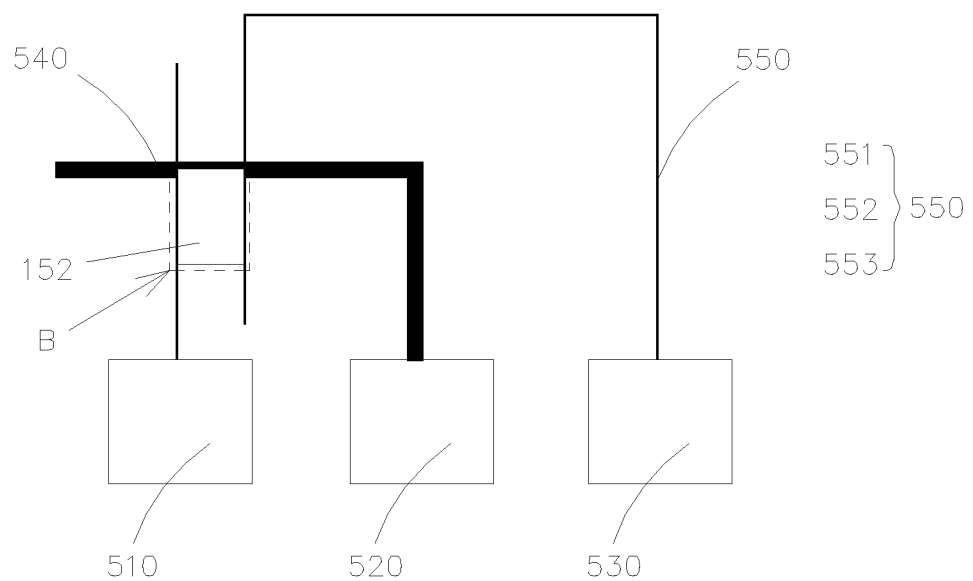
FIG. 6 is a schematic view of a testing circuit of a display device according to a second embodiment of the present invention.
Figure 7:
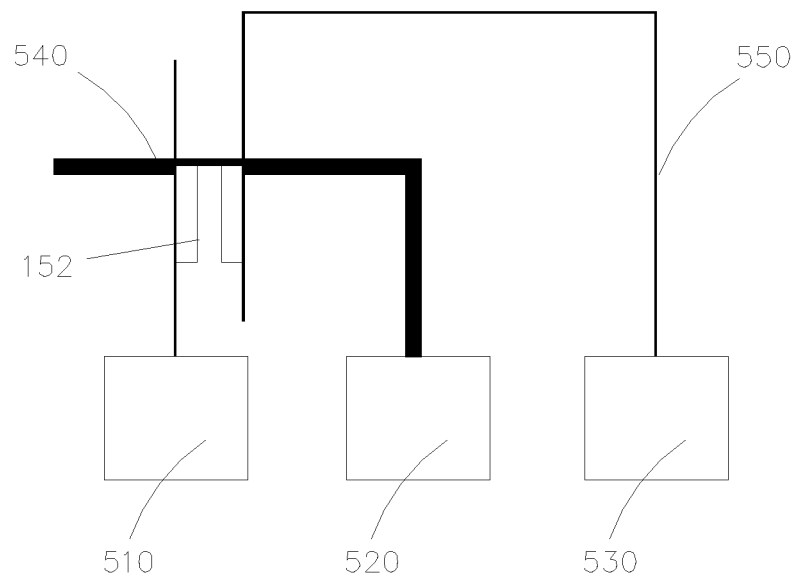
FIG. 7 is a schematic view of the testing circuit of the display device after laser cutting according to the second embodiment of the present invention.

In the second embodiment of the present invention as shown in FIGS. 6 and 7, the testing circuit 500 comprises a first detection pad 510, a second detection pad 520, a third detection pad 530, a first detection metal wire 540 and a second detection metal wire 550. The first detection metal wire 140 is insulated from the gate electrode of the thin film transistor, and the second detection metal wire 150 is insulated from the source and drain electrodes of the thin film transistor. Further, the second detection metal wire 550 comprises a first branch 551, a detection metal pad 552 and a second branch 553. The first branch 551 is connected to the first detection pad 510 and the detection metal pad 552, and the second branch 553 is connected to the third detection pad 530 and the detection metal pad 552.

The second embodiment is difference from the first embodiment in that the detection metal pad 552 partially overlaps with the first detection metal wire 540 in a vertical direction. That is, the second detection metal wire 550 intersects with the first detection metal wire 540 in a vertical projection direction to form an intersection region (as shown by a dashed block B in FIG. 6) where the first detection metal wire 540 is partially covered by the second detection metal wire 550.

In the second embodiment, it is possible to simulate the gate line of the first metal layer in the display area using the first detection metal wire 140 and to simulate the data line of the second metal layer in the display area using the detection metal pad 152 of the second detection metal wire 150, in a similar manner as the first embodiment. Also, it is possible to simulate the gate electrode of the thin film transistor using the first detection metal wire 540 and to simulate the drain electrode or the source electrode of the thin film transistor using the detection metal pad 552 of the second detection metal wire 550.

The testing circuit 500 simulates the repairing of the residual films of the gate line and the data line, or simulates the repairing of the residual films of the gate electrode, the drain electrode or the source electrode of the thin film transistor. While the display area is repaired, the testing circuit 500 is repaired by laser at the same time, and the electrical parameters of the first detection pad 510, the second detection pad 520 and the third detection pad 530 of the testing circuit 500 are detected according to the repairing and detecting method described above to ascertain the repairing result in the display area. When the detecting result is unsatisfied, the laser energy can be adjusted immediately to improve the repair effect.

The present invention is implemented to a variety of other embodiments, and a variety of changes and modifications can be made to the invention by those skilled in the art without departing from the spirit and scope of the invention. All of these changes and modifications are intended to be included within the scope of the appended claims.

INDUSTRIAL APPLICABILITY

In the testing circuit of the display device of the present invention, the first detection metal wire is used to simulate the gate line and the detection metal pad (or the intersection region) of the second detection metal wire is used to simulates the data line. When laser cutting and detecting are performed on the thin film transistor by the method for repairing and detecting thin film transistor according to the present invention, the repairing result can be ascertained instantly, and the laser energy can be adjusted immediately when the detecting result is unsatisfied, thereby improving the repair effect.

The invention claimed is:

1. A display device, comprising:
    a plurality of thin film transistors, each of the plurality of thin film transistors having a gate electrode, a source electrode and a drain electrode;
    a gate line, coupled to the gate electrode of the thin film transistor;
    a data line, coupled to the drain electrode or the source electrode of the thin film transistor; and
    a testing circuit, comprising:
        a first detection pad;
        a second detection pad;
        a third detection pad;
        a first detection metal wire connected to the second detection pad; and
        a second detection metal wire having a first branch, a detection metal pad and a second branch, the first branch connecting the first detection pad and the detection metal pad, the second branch connecting the third detection pad and the detection metal pad, and the detection metal pad overlaps with the first detection metal wire in a vertical direction;
    wherein a width of the first detection metal wire is the same as a width of the gate line, and a width of the detection metal pad is the same as that of the data line.

2. The display device of claim 1, wherein a material of the first detection metal wire is the same as a material of the gate line, and wherein a material of the detection metal pad is the same as a material of the data line.

3. The display device of claim 1, wherein the first detection metal wire and the gate line are formed by a same mask process, and wherein the detection metal pad and the data line are formed by a same mask process.

4. The display device of claim 1, wherein the detection metal pad has an opening.

5. A display device, comprising:
    a substrate;
    a first metal layer, disposed on the substrate;
    an insulating layer, disposed on the first metal layer;
    a second metal layer, disposed on the insulating layer, such that the insulating layer is positioned between the first metal layer and the second metal layer; and
    a thin film transistor, having a gate electrode, a source electrode and a drain electrode, wherein the gate electrode is patterned-formed of the first metal layer, and a source electrode and a drain electrode are patterned-formed of the second metal layer; and
    a testing circuit, comprising:
        a first detection pad, disposed on the substrate;
        a second detection pad, disposed on the substrate;
        a third detection pad, disposed on the substrate;
        a first detection metal wire, patterned-formed of the first metal layer, wherein the first detection metal wire is electrically connected to the second detection pad and insulated from the gate electrode; and
        a second detection metal wire, patterned-formed of the second metal layer, wherein the second detection metal wire is electrically connected to the first and third detection pads, respectively, and insulated from the source and drain electrodes,
wherein the second detection metal wire intersects with the first detection metal wire to form an intersection region.

6. The display device of claim 5, further comprising a gate line coupled to the gate electrode and a width of the gate line is the same as a width of the first detection metal wire.

7. The display device of claim 5, further comprising a data line coupled to the drain electrode or the source electrode and a width of the data line is the same as a width of the intersection region of the second detection metal wire.

8. The display device of claim 7, wherein the second detection metal wire comprises a first branch, a detection metal pad and a second branch, wherein the first branch connects the first detection pad and the detection metal pad, wherein the second branch connects the third detection pad and the detection metal pad, and wherein the detection metal pad is positioned in the intersection region.

9. The display device of claim 5, wherein the substrate comprises a display area and a peripheral area adjacent to the display area, wherein the thin film transistor is disposed in the display area, and wherein the testing circuit is disposed in the peripheral area.

10. The display device of claim 5, wherein the second detection metal wire has an opening in the intersection region.

11. A method for repairing and detecting a thin film transistor of the display device of claim 5, the method comprising:
S100 for cutting the second detection metal wire in the intersection region by laser;
S200 for detecting a resistance value between the first detection pad and the third detection pad, and increasing laser energy when the detected resistance value is less than a threshold value;
S300 for detecting a resistance value between the first detection pad and the second detection pad, and decreasing laser energy when the detected resistance value is less than a threshold value; and
S400 for determining the laser energy for repairing to be appropriate when each of the resistance values between the first and third detection pads and between the first and second detection pads is detected to be greater than the respective threshold value.

12. The method for repairing and detecting the thin film transistor of claim 11, wherein the step S200 is performed prior to the step S300.

13. The method for repairing and detecting the thin film transistor of claim 11, wherein the step S300 is performed prior to the step S200.

* * * * *